United States Patent [19]
Chan et al.

[11] Patent Number: 5,998,860
[45] Date of Patent: Dec. 7, 1999

[54] DOUBLE SIDED SINGLE INLINE MEMORY MODULE

[75] Inventors: Boon Pew Chan; Kian Teng Eng, both of Singapore, Singapore

[73] Assignee: Texas Instruments Incorporated, Dallas, Tex.

[21] Appl. No.: 08/994,955

[22] Filed: Dec. 19, 1997

[51] Int. Cl.$^6$ .......................... H01L 23/50; H01L 23/12; H01L 23/16

[52] U.S. Cl. .......................... 257/679; 257/723; 257/680; 257/202; 257/668; 257/693; 257/738; 257/737; 257/673

[58] Field of Search ...................... 257/723, 730, 257/680, 679, 668, 685, 686, 48, 787, 693, 692, 691, 690, 773, 774, 910, 909, 919, 202, 673

[56] References Cited

U.S. PATENT DOCUMENTS

| | | | |
|---|---|---|---|
| 3,179,913 | 4/1965 | Mittler et al. | 339/18 |
| 3,370,203 | 2/1968 | Kravitz et al. | 317/101 |
| 3,459,998 | 8/1969 | Focarile | 317/100 |
| 3,904,934 | 9/1975 | Martin | 317/101 |
| 4,288,841 | 9/1981 | Gogal | 361/414 |
| 4,502,098 | 2/1985 | Brown et al. | 361/383 |
| 4,574,331 | 3/1986 | Smolley | 361/393 |
| 4,646,128 | 2/1987 | Carson et al. | 257/273 |
| 4,727,410 | 2/1988 | Higgins, III | 257/700 |
| 4,823,233 | 4/1989 | Brown et al. | 361/383 |
| 4,833,568 | 5/1989 | Berhold | 361/383 |
| 4,862,249 | 8/1989 | Carlson | 257/668 |
| 4,868,712 | 9/1989 | Woodman | 361/388 |
| 4,953,005 | 8/1990 | Carlson et al. | 257/646 |
| 5,016,138 | 5/1991 | Woodman | 361/381 |
| 5,019,945 | 5/1991 | Smolley | 361/412 |
| 5,200,917 | 4/1993 | Shaffer et al. | 365/51 |
| 5,723,907 | 3/1998 | Akrom | 257/679 |
| 5,811,879 | 9/1998 | Akrom | 257/723 |
| 5,817,535 | 10/1998 | Akrom | 438/15 |

*Primary Examiner*—Alexander Oscar Williams
*Attorney, Agent, or Firm*—Mark A. Valetti; W. James Brady; Richard L. Donaldson

[57] ABSTRACT

A double sided single inline memory module (20) comprising a substrate (70) having a plurality of openings (86) and first and second surfaces (92, 94), a plurality of pads (82) being integral with the substrate (70) and extending into the opening (86), a plurality of chips (50) adhered to the substrate (70) having bonding pads (120), wire bonding (80) electrically connecting at least one of the bonding pads (120) to at least one of the pads (82) and potting material (90) encapsulating the wire bonding (80) and filling the opening (86) is disclosed.

16 Claims, 2 Drawing Sheets

DOUBLE SIDED SINGLE INLINE MEMORY MODULE

TECHNICAL FIELD OF THE INVENTION

The present invention relates in general to the field of single inline memory modules (SIMMs), and more specifically, the present invention relates to a substantially flat, double sided SIMM and a method for producing the same.

BACKGROUND OF THE INVENTION

Without limiting the scope of the invention, its background is described in connection with single inline memory modules, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are packaging related.

The integrated circuit must be packaged in a suitable media that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to an individual lead frame, where, following wire bonding and encapsulation, designated parts of the lead frame become the terminals of the package. The packaging of integrated circuits has also involved the placement of chips on a flexible board where, following adhesion of the chip to the surface of the flexible board and wire bonding, an encapsulant is placed over the chip and the adjacent flexible board to seal and protect the chip and other components.

Commonly, integrated circuit packages are attached to other components such as a printed circuit board to form single inline memory modules which are typically referred to as SIMMs. SIMMs may, for example, be used to increase the memory of typically personal computers. As memory demands increase, so has the need for increased Input/Output (I/O) capacity and memory capacity of SIMMs. Efforts to enhance these capacities, however, have been limited by the amount of space available in the environment in which the SIMMs operate.

Therefore, a need has arisen for SIMM and a process for producing a SIMM that dispenses with the need to mount previously assembled integrated circuit packages on the printed circuit board. A need has also arisen for materials and methods that lead to increased yield by more closely matching the coefficient of thermal expansion of the materials used in the memory module. Further, a need has arisen for flat, double sided SIMM that provides protection for the silicon chip during subsequent manufacturing and testing steps and from the environment of its intended purpose.

SUMMARY OF THE INVENTION

The present invention disclosed herein comprises a double sided SIMM and a process for producing a double sided SIMM that protects the components of the SIMM during manufacturing and testing steps and from the environment of its intended purpose.

The double sided SIMM of the present invention comprises a substrate having a plurality of openings, first and second surfaces, tabs and conduits. A plurality of pads are integral with the substrate and extend into the openings. A plurality of tabs are disposed on the first and second surfaces. At least one of the tabs is electrically connected with at least one of the conduits, which connects to at least one of the pads. A plurality of chips are adhered to the substrate at the openings. Each chip has bonding pads disposed thereon. Wire bonding electrically connects the bonding pads to the pads. A potting material is placed in the opening and provides protection to the wire bonding.

The double sided SIMM of the present invention may further include bus bars being integral with the substrate and extending into the openings. The bus bar electrically connects at least one of the bonding cads of the chips to at least one the tabs disposed on the substrate by a conduit.

The present invention is also directed to a process for producing a double sided SIMMs comprising the steps of obtaining a substrate having a plurality of openings and first and second surfaces. A plurality of pads are extended within the substrate to the openings. A plurality of tabs are also disposed on the substrate. At least one of the tabs is electrically connected with at least one of the pads. At least one chip is adhered to the substrate, the chip having at least one bonding pad that is electrically connected to at least one of the pads with wire bonding. Finally, the opening is covered with a potting material to hermetically seal the wire bonding.

The process for producing a double sided SIMM may further include the steps of, disposing at least one bus bar on the substrate and electrically connecting it to at least one bonding pad with wire bonding, and electrically connecting the bus bar with at least one tab disposed on the substrate.

BRIEF DESCRIPTION OF THE DRAWINGS

For a more complete understanding of the features and advantages of the double sided single inline memory module of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is related to high frequency integrated circuit design for making a double sided SIMM. The double sided SIMM uses a double sided substrate to achieve high speed performance and to meet the space constraint requirements of modern semiconductors. The principles of the present invention may be incorporated into, for example, a SIMM with synchronous DRAM (SDRAM) silicon chip. The present invention, however, is also applicable to SIMMS using LOGIC, SRAM, EPROM or other memory devices.

Figure 1:
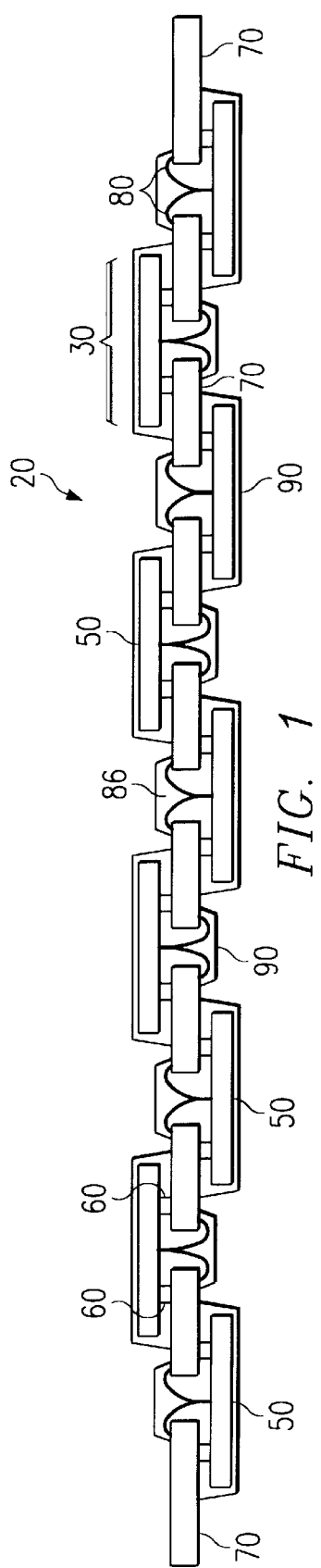
FIG. 1 is a simplified side cross-sectional view of a double sided SIMM of the present invention.

FIG. 1 is a simplified side cross-sectional view of an double sided SIMM that is generally designated 20. The double sided SIMM 20 is made up of integrated circuit units 30, which comprise a silicon chip 50, which can be, for example, any integrated circuit component such as a DPAM. The silicon chip 50 is attached to a printed circuit board 70 by an adhesive layer 60. The adhesive layer 60 may be made of, for example, a double-sided adhesive polyamide tape, adhesive glue or epoxy.

The printed circuit board 70 may be constructed from a material such as FR-4 which is available from, for example, Motorola Inc., U.S.A. FR-4 is an epoxy resin reinforced with a woven glass cloth. In selecting the material for printed circuit board 70, one skilled in the art will recognize that four parameters should be considered, namely, thickness, dielectric constant, glass transition temperature and the coefficient of thermal expansion.

Thickness is dependant on the number of layers required and the amount of reinforcement used in a given layer. The reinforcing glass cloth can range in thickness from 2 mil per sheet (type 106) to about 8 mil per sheet (type 7628). Dielectric constant is determined by a combination of the resin used and the thickness and type of reinforcement used. Standard FR-4 has a dielectric constant of about 4.5. This constant can be reduced to about 3 by replacing the epoxy resin with a cyanate ester resin. The greater the thickness, however, the greater the problems associated with thickness control, rough surfaces, excessive drill reflection and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/° C. A difference in the coefficient of thermal expansion between the printed circuit board 70 made from FR-4 and the silicon chip 50 can lead to failure of the double sided single inline memory module 20 during, not only the assembly of the double sided single inline memory module 20, but also during the use of the double sided single inline memory module 20.

The adhesive layer 60 may be Hitachi HM122u. Alternatively, the silicon chip 50 can be adhered to the printed circuit board 70 with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the printed circuit board 70 at 160° C. for 5 seconds with an applied force of 1000–3000 grams; then attaching the silicon chip 50 on the film at 220° C. for 5 seconds under a force of 150–200 grams.

| DF-335 has the following properties | | | |
|---|---|---|---|
| Test | Remarks | Units | DF-335 |
| Appearance | Visual | — | silver film |
| Solid Content | 200° C.-2 h | wt % | ≧96 |
| Ash Content | 600° C.-1.5 h | wt % | 40 |
| Ash Content/Solid | 600° C.-1.5 h | wt %/solid | 42 |
| Thickness | Dial gauge | μm | 25 |
| Tensile Strength | R.T. | kgf/mm² | 7.1 |
| Tensile Modulus | R.T. | kgf/mm² | 271 |
| Die shear strength | 4 × 4 mm chip/Ag plated alloy 42 | kgf/chip | |
| R.T. | | | ≧10 |
| 250° C. | | | 0.9 |
| Peel strength 240° C. (after/ 85° C. 85%, 48 h) | 8 × 8 mm chip/bare alloy 42 | kgf/chip | ≧3.0 |
| Tg | TMA, 180° C.-1 h cured | ° C. | 123 |
| Modulus | Viscoelastic spectrometer | Mpa | 1300 |
| Moisture | 85° C./85% RH, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the printed circuit board 70. Commonly used are adhesive tapes based on elastomers, silicones or acrylics because of their ease of use and easy incorporation into production.

Figure 2:
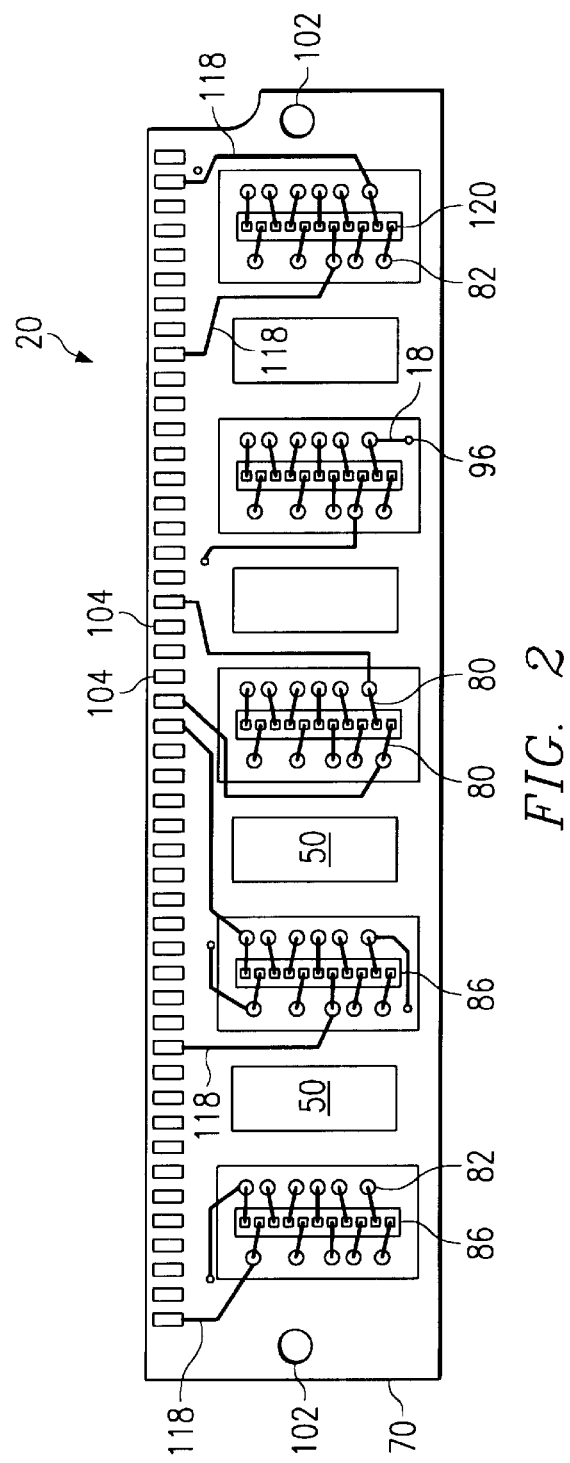
FIG. 2 is a simplified top view of a double sided SIMM of the present invention.

Referring collectively to FIGS. 1 and 2, the silicon chip 50 has bonding pads 120 located generally in the central area of silicon chip 50. The bonding pads 120 are connected to pads 82 by wire bonding 80. As appreciated from this top view of the double sided SIMM 20 of the present invention, the silicon chips 50 are positioned with the operative faces alternating between a "face-up" and a "face-down" position. Alternatively, the silicon chips 50 may all be positioned facing the same direction on a single side of printed circuit board 70 (not depicted). It should be understood by one skilled in the art that the terms "topa" and "bottom" as well as the terms "side" and "end" are used for illustration purposes only, as the double sided SIMM 20 of the present invention can be assembled and used in a variety of positions and ways.

Locating holes 102 are shown, which allow for the correct positioning of the double sided SIMM 20 of the present invention into, for example, an expansion slot (not depicted). Such an expansion slot may be located on a motherboard, or alternatively, may be on a sister-board or other board used to electrically connect the double sided SIMM 20 to a computer. To electrically connect to the expansion slot, tabs 104 are disposed on the printed circuit board 70. The tabs 104 are then connected to the integrated circuit units 30 by conduits 118. These conduits 118 may electrically connect the integrated circuit units 30 to each other, or to an expansion slot through tabs 104. Power or ground may be input from a tab 104 to a pad 82, by a conduit 118 to Pin #1 96, a pin typically reserved for power or ground connection. Current then flows from the pad 82 to the bonding pad 120 on silicon chip 50 through wire bonding 80, thereby providing silicon chip 50 with a power connection from the expansion slot to the silicon chin 50.

Figure 3:
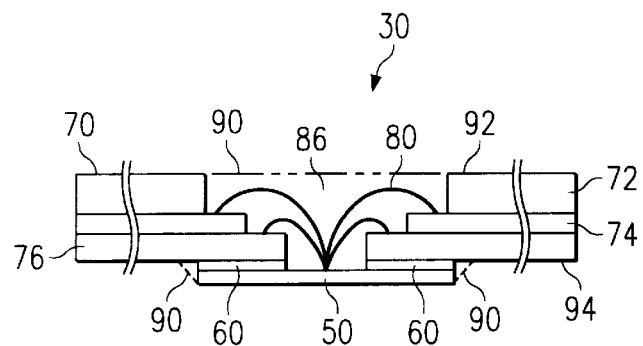
FIG. 3 is a simplified side cross-sectional view of one embodiment of an integrated circuit unit of the present invention.

FIG. 3 shows a simplified side cross-sectional view of an integrated circuit unit 30, which comprise a silicon chip 50, attached to the printed circuit board 70 by an adhesive layer 60. The printed circuit board 70 consists of three layers, a top layer 72, an intermediate layer 74, a bottom layer 76.

Even though FIG. 3 depicts printed circuit board 70 as having three layers 72, 74, and 76, it should be understood by one skilled in the art that printed circuit board 70 may consist of a single layer or may be a multi-layered board having an alternate number of layers.

The above described components and their constructions and interrelation provide an assembly that is encapsulated as described below. The term "assembly" refers to the assembled components prior to encapsulation. The assembly consists of printed circuit board 70, adhered silicon chips 50 and wire bonding 80. The printed circuit board 70 has a top opening 86 with pads 82 extending into the top opening 86.

The wire bonding 80 process may begin after silicon chic 50 has been adhered to printed circuit board 70. Silicon chip 50 and printed circuit board 70 are then positioned on a heated pedestal to raise the temperature of the combination to a point between 100°–300° C. A gold wire having a diameter typically ranging from 0.7 mil. to 1.3 mil. is strung through a heated capillary where the temperature may range between 200°–500° C. A soldering ball is created at the end of the wire using either a flame or a spark technique. The soldering ball is then brought to bonding pad 120 on the silicon chip 50 and a combination of compression force and ultrasonic energy are used to create the desired metallurgical bond. Using this "stitch" technique significantly reduces the cross-section of the wire at that point. A loop is then created in the wire bonding 80 above the bond that has just been achieved, and the wire bonding 80 is routed to the desired connection on the printed circuit board 70 such as pad 82 or bus bar (not depicted). The wire bonding 80 is clamped and the capillary raised, such that the wire bonding 80 will break free at the outer edge of the bond. This process is repeated until all the bonding pads 120 that require electrical connection on the silicon chip 50 are electrically connected to printed circuit board 70.

Following the assembly of the above-described components, the top opening 86 is filled with potting material 90 as represented by the dashed line above top opening 86 and between silicon chin 50 and bottom surface 94 of the printed circuit board 70.

The potting material 90 may be a cyanate ester-type resin available from Shin-Etsu Chemical Co., Ltd., such as KMC 184VA and KMC 188VA-4. Other examples of potting materials that may be used with the present invention include epoxies, polyesters, polyimides, cyanoacrylates, ceramic, silicone and urethane. The potting materials may also contain fillers that affect the coefficient of thermal expansion, as well as the strength and flexibility of the potting material. The selection of potting materials and fillers will depend on the components used to make the double sided single inline memory module 20, as will be known to those of skill in the art in light of the present disclosure.

Properties of Typical Potting Resins

|  | Epoxy | Polyester | Silicone | Urethane |
|---|---|---|---|---|
| Dielectric constant, D-150 | | | | |
| 60 Hz | 3.9 | 4.7 | 2.7 | 5.7 |
| $10^6$ Hz | 3.2 | — | 2.7 | 3.4 |
| Dissipation factor, D-150 | | | | |
| 60 Hz | 0.04 | 0.017 | 0.001 | 0.123 |
| $10^6$ Hz | 0.03 | — | 0.001 | 0.03 |
| Dielectric strength, D-149; V/mil | 450 | 325 | 550 | 400 |
| Volume resistivity, D-257; $\Omega \cdot cm$ | $10^{15}$ | $10^{14}$ | $10^{15}$ | $10^{13}$ |
| Arc resistance, D-495; seconds | 150 | 135 | 120 | 180 |
| Specific gravity, D-792 | 1.15 | 1.2 | 1.05 | 1.0 |
| Water absorption, D-570; % 24 h | 0.15 | 0.3 | 0.12 | 0.4 |
| Heat deflection temperature, D-648; at 264 lb/in², ° F. | 380 | 260 | <70 | <70 |
| Tensile strength, D-638; lb/in² | 9000 | 10,000 | 1000 | 2000 |
| Impact strength (Izod), D-256; ft · lb/in | 0.5 | 0.3 | No break | No break |
| Coefficient of thermal expansion, D-969; $10^{-5}$/° F. | 5.5 | 7.5 | 4.0 | 15 |
| Thermal conductivity, C-177; Btu · in/(h · ft² · ° F.) | 1.7 | 1.7 | 1.5 | 1.5 |
| Linear shrinkage; % | 0.3 | 3.0 | 0.4 | 2.0 |
| Elongation, D-638; % | 3 | 3 | 175 | 300 |

Figure 4:
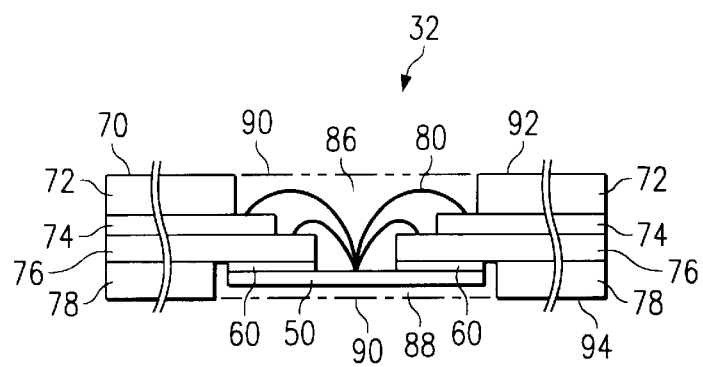
FIG. 4 is a simplified side cross-sectional view of a second embodiment of an integrated circuit unit of the present invention.

FIG. 4 is a simplified cross-sectional view of another embodiment of a integrated circuit unit that is generally designated 32 for use with the double sided SIMM 20 of the present invention. The integrated circuit unit 32 comprises a silicon chip 50 and a printed circuit board 70 which is attached to the silicon chip 50 by an adhesive layer 60. In this embodiment, the printed circuit board 70 consists of four layers, a top layer 72, an intermediate layer 74, a second intermediate layer 76 and a bottom layer 78. The printed circuit board 70 has a top opening 86 and a cavity 88. As best seen in conjunction with FIG. 2, pads 82 extend into the top opening 86. After assembly, top opening 86 and cavity 88 are filled with potting material 90 as represented by the dashed line above top opening 86 and below cavity 88. In this embodiment, a substantially flat double sided SIMM 20 is created with no protrusions that may interfere with insertion into an expansion slot.

Figure 5:
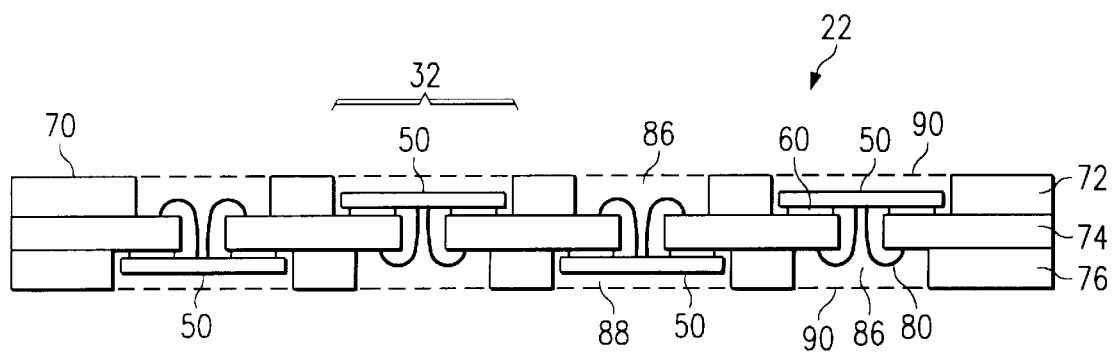
FIG. 5 is a simplified side cross-sectional view of a double sided SIMM of the present invention.

FIG. 5 is a simplified side cross-sectional view of an alternative embodiment of an double sided SIMM that is generally designated 22. The double sided SIMM 22 has a printed circuit board 70 that is attached to silicon chips 50 by adhesive layers 60. The printed circuit board 70 consists of three layers, a top layer 72, an intermediate layer 74, and a bottom layer 76, and a plurality of top openings 86 and a plurality of cavities 88. Top opening 86 and cavity 88 are filled with potting material 90 to hermetically isolate the silicon chips 50 adhered to printed circuit board 70. The 5 potting material 90 also serves to hermetically seal the wire bonding 80 and the silicon chips 50.

Intermediate layer 74 has pads 82 that are electrically connected to silicon chip 50 by wire bonding 80. As best seen in FIG. 2, bonding pads 120 located generally in the central area of silicon chip 50 are connected to pads 82 by using a "stitch" technique to electrically connect the silicon chip 50 to the printed circuit board 70 by wire bonding 80.

Although the double sided SIMMs 20 and 22 and the integrated circuit units 30 and 32 as depicted, have been described using centralized bonding pads 120, it should be understood by one skilled in the art that the principles of the present invention are applicable to a silicon chip 50 with bonding pads 120 in alternate layouts such as positioned along the sides of the silicon chip 50, with an appropriate accommodation of the top opening 86.

Also, it should be noted by one skilled in the art that bus bars may be located on a single layer of printed circuit board 70. Generally, a layer of insulated tape or coating may be placed on the bus bars to provide for electrical isolation.

The advantage of a multi-layer printed circuit board 70, however, is the elimination of the need to insulate any such bus bars. Additionally, the multi-layer printed circuit board 70 provides a greater process margin for wire bonding 80.

The present invention alternates the positioning of the functional face of the silicon chip 50 to achieve an overall reduction in height. It also allows for decreased failure due to the reduced number of soldered materials having varying coefficients of thermal expansion. The present invention further reduces the overall number of steps in the assembly of SIMMs 20 and 22 by streamlining the assembly process not only in reduced number of steps, but also by elimination the curing steps associated with encapsulating integrated circuits prior to assembling them into a memory module. The present invention further reduces the amount of material used in producing SIMMs 20 and 22, thereby saving time, money and the environment.

Furthermore, the method of the present invention takes advantage of the opening 86 at the center of the printed circuit board 70 for potting the wire bonding 80 that connects the silicon chip 50 and the printed circuit board 70 in a single step. By filling the opening 86 with potting material 90, the wire bonding 80 between silicon chip 50 and the printed circuit board 70 are generally protected from the environment and are particularly protected from moisture due to the hermetic nature of the encapsulation.

This means of potting the double sided SIMMs 20 and 22 of the present invention, best seen in FIG. 3 as an integrated circuit unit 30, greatly reduces the overall profile by allowing the non-operative or backside of the silicon chip 50 to be exposed. By hermetically protecting the connections between the silicon chip 50 and the printed circuit board 70 at the top opening 86, there is no need to completely encapsulate the entire assembly. The entire double sided SIMM 20 or 22 may be encapsulated, however, with a thin transparent layer to further hermetically seal the double sided SIMM 20 or 22.

Additionally, reduced environmental impact is obtained using the method and apparatus of the present invention due to the overall decrease in the size of the double sided SIMMs 20 and 22.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A single inline memory module comprising:
    a substrate having first and second surfaces, said substrate having a plurality of openings extending between said first and second surfaces;
    a plurality of chips electrically connected to said substrate, each of said chips adhered to said substrate proximate one of said openings;
    and wherein a first portion of said plurality of chips is adhered to said first surface of said substrate and electrically connected to said second surface of said substrate through said openings in said substrate, and a second portion of said plurality of chips is adhered to said second surface of said substrate and electrically connected to said first surface of said substrate through said openings in said substrate.

2. The single inline memory module as recited in claim 1 further comprising a plurality of tabs disposed on said first and second surfaces.

3. The single inline memory module as recited in claim 2 further including a plurality of pads disposed on said first and second surfaces, at least one of said pads electrically connected to at least one of said tabs.

4. The single inline memory module as recited in claim 3 wherein said chips each further include at least one bonding pad.

5. The single inline memory module as recited in claim 4 further including wire bonding electrically connecting at least one of said bonding pads to at least one of said pads.

6. The single inline memory module as recited in claim 5 further including potting material encapsulating said wire bonding and filling said openings.

7. The single inline memory module as recited in claim 1 further including potting material encapsulating said chips.

8. The single inline memory module as recited in claim wherein said substrate further includes a plurality of cavities and wherein said chips are adhered to said substrate said cavities.

9. The single inline memory module as recited in claim 8 further including potting material encapsulating said chips thin said cavities.

10. A single inline memory module comprising:
    a substrate having first and second surfaces, said substrate having a plurality of openings extending between said first and second surfaces;
    a plurality of tabs disposed on said first and second surfaces;
    a plurality of pads disposed on said first and second surfaces, at least one of said pads electrically connected to at least one of said tabs;
    a plurality of chips each having an operative side adhered to said substrate, each of said chips having at least one bonding pad on said operative side;
    wire bonding electrically connecting at least one of said bonding pads to at least one of said pads;
    potting material encapsulating said wire bonding and filling said openings;
    and wherein a first portion of said plurality of chips is adhered to said first surface of said substrate and electrically connected to said second surface of said substrate through said openings in said substrate, and a second portion of said plurality of chips is adhered to said second surface of said substrate and electrically connected to said first surface of said substrate through said openings in said substrate.

11. The single inline memory module as recited in claim 10 wherein all of said bonding pads on said operative side of said chips are facing in the same direction.

12. The single inline memory module as recited in claim 11 wherein said bonding pads on said operative side of said chips adhered to said first surface are facing in opposing direction from said bonding pads on said operative side of said chips adhered to said second surface.

13. The single inline memory module as recited in claim 10 further including potting material encapsulating said chips.

14. The single inline memory module as recited in claim 10 further including potting material sealing around the perimeter of said chips along said substrate.

15. The single inline memory module as recited in claim 10 wherein said substrate further includes a plurality of cavities and wherein said chips are adhered to said substrate in said cavities.

16. The single inline memory module as recited in claim 15 further including potting material encapsulating said chips within said cavities.

* * * * *